US008823399B1

(12) United States Patent
Bharathan

(10) Patent No.: US 8,823,399 B1
(45) Date of Patent: Sep. 2, 2014

(54) DETECT AND DIFFERENTIATE TOUCHES FROM DIFFERENT SIZE CONDUCTIVE OBJECTS ON A CAPACITIVE BUTTON

(71) Applicant: Cypress Semiconductor Corporation, San Jose, CA (US)

(72) Inventor: Vibheesh Bharathan, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/224,854

(22) Filed: Mar. 25, 2014

Related U.S. Application Data

(60) Provisional application No. 61/887,868, filed on Oct. 7, 2013.

(51) Int. Cl.
| | | |
|---|---|---|
| *G01R 27/02* | (2006.01) |
| *G01R 27/26* | (2006.01) |
| *G01R 19/00* | (2006.01) |
| *G06F 1/00* | (2006.01) |
| *G06F 3/00* | (2006.01) |
| *G01R 1/00* | (2006.01) |
| *G01R 5/00* | (2006.01) |
| *G01R 3/00* | (2006.01) |

(52) U.S. Cl.
CPC .............. *G01R 27/2605* (2013.01); *G06F 1/00* (2013.01); *G06F 3/00* (2013.01); *G01R 1/00* (2013.01); *G01R 5/00* (2013.01); *G01R 3/00* (2013.01)
USPC ......... 324/684; 324/603; 324/76.11; 324/663

(58) Field of Classification Search
CPC .............. G01R 1/00; G01R 3/00; G01R 5/00; G01R 27/2605; G06F 1/00; G06F 3/00
USPC ............................... 324/663, 684, 603, 76.11
See application file for complete search history.

(56) References Cited

U.S. PATENT DOCUMENTS

| | | | |
|---|---|---|---|
| 2012/0256638 A1* | 10/2012 | Van Antwerpen et al. | ... 324/613 |
| 2013/0057251 A1* | 3/2013 | Ahn et al. | ................. 324/76.11 |
| 2013/0307823 A1* | 11/2013 | Grivna et al. | ................. 345/174 |

OTHER PUBLICATIONS

Atmel, Long Slide Controls with QMatrix ICs. Application Note QTAN0030. Jun. 20088 pages.
Bohn, Bruce. Microchip CTMU for Capacitive Touch Applications. Microchip Technology, Inc. Jan. 6, 2009. 22 pages.

* cited by examiner

*Primary Examiner* — Melissa Koval
*Assistant Examiner* — Farhana Hoque
(74) *Attorney, Agent, or Firm* — Lowenstein Sandler LLP

(57) ABSTRACT

Apparatuses and methods of capacitive buttons and detecting and differentiating touches from different size conductive objects on the capacitive buttons. One apparatus includes a capacitance-sensing circuit coupled to a capacitive button. The capacitive button includes a first sense element and a second sense element. The capacitance-sensing circuit is operative to measure signals from the first sense element and the second sense element with a sensing parameter (also referred to as tuning properties) set to a first value. The signals correspond to capacitances of the first sense element and second sense element. An inner perimeter of the first sense element is disposed to surround (at least in part) an outer perimeter of the second sense element. The apparatus further includes processing logic coupled to the capacitance-sensing circuit. The processing logic is operative to detect whether the first sense element is activated by a conductive object proximate to the capacitive button based on the measured signals. The processing logic detects whether the second sense element is activated by the conductive object proximate to the capacitive button based on the measured signals. The processing logic adjusts the first value to a second value for the sensing parameter when the second sense element is activated and the first sense element is not activated. The capacitance-sensing circuit is operative to measure an additional signal from the second sense element with the sensing parameter set to the second value when the second sense element is activated and the first sense element is not activated.

18 Claims, 9 Drawing Sheets

US 8,823,399 B1

DETECT AND DIFFERENTIATE TOUCHES FROM DIFFERENT SIZE CONDUCTIVE OBJECTS ON A CAPACITIVE BUTTON

RELATED APPLICATIONS

This application claims the benefit of U.S. Provisional Application No. 61/887,868, filed Oct. 7, 2013, the entire contents of which are incorporated by reference herein.

TECHNICAL FIELD

The present disclosure relates generally to sensing systems, and more particularly to capacitance-sensing systems configurable to detect and differentiate touches from different size conductive objects on a capacitive button.

BACKGROUND

Capacitance sensing systems can sense electrical signals generated on electrodes that reflect changes in capacitance. Such changes in capacitance can indicate a human touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Devices that utilize capacitive sense buttons or arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self-capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings.

DETAILED DESCRIPTION

Figure 1:
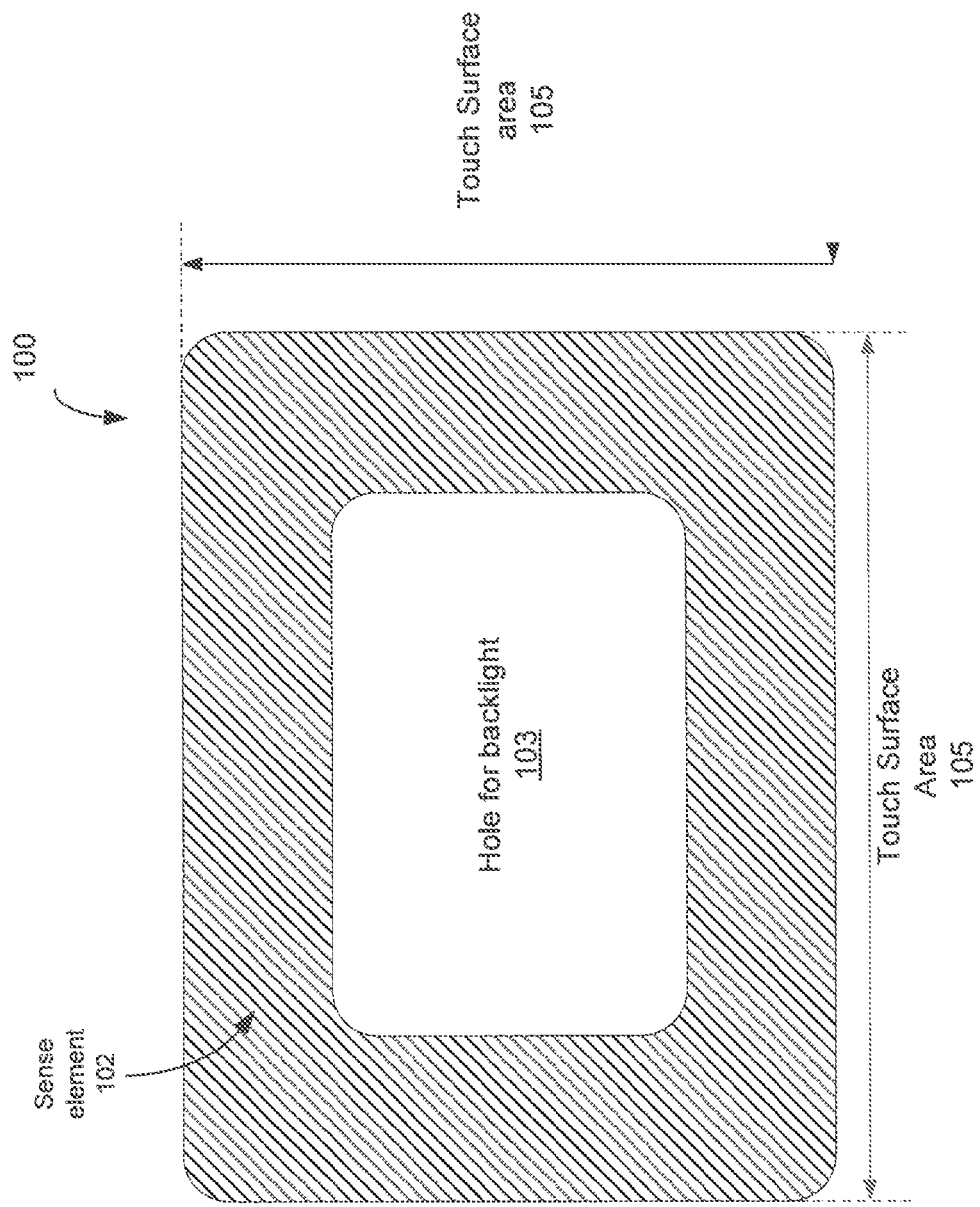
FIG. 1 illustrates a capacitive button according to one implementation.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Apparatuses and methods of capacitive buttons and detecting and differentiating touches from different size conductive objects on the capacitive buttons. One apparatus includes a capacitance-sensing circuit coupled to a capacitive button. The capacitive button includes a first sense element and a second sense element. The capacitance-sensing circuit is operative to measure signals from the first sense element and the second sense element with a sensing parameter set to a first value (also referred to as tuning properties). The signals correspond to capacitances of the first sense element and second sense element. An inner perimeter of the first sense element is disposed to surround an outer perimeter of the second sense element. It should be noted that "surround" as used herein means the sense element is disposed to completely surround the other sense element in a circular fashion or to surround most of the other sense element. That is, it is not required that the outer sense element completely encircle the inner sense element for proper operation. For example, the sense elements may have shapes that prevent the outer sense element from completely encircling the inner sense element, but surrounds most of the inner sense element or a majority of the inner sense element. The apparatus further includes processing logic coupled to the capacitance-sensing circuit. The processing logic is operative to detect whether the first sense element is activated by a conductive object proximate to the capacitive button based on the measured signals. The processing logic detects whether the second sense element is activated by the conductive object proximate to the capacitive button based on the measured signals. The processing logic adjusts the sensing parameter to a second value when the second sense element is activated and the first sense element is not activated. The capacitance-sensing circuit is operative to measure an additional signal from the second sense element with the sensing parameter set to the second value when the second sense element is activated and the first sense element is not activated. The capacitance-sensing circuit measures additional signals from the first sense element and the second sense element with the sensing parameter set to the first value when the first and second sense elements are activated. In some embodiments, a surface area of the second sense element is at least partially encompassed by the first sense element. In other embodiments, the first sense element encompasses an area of the second sense element. In other embodiments, at least a portion of the first sense element is at least partially outside an outer perimeter of the second sense element. In other embodiments, touches from objects with 1 mm, 3 mm 5 mm and 10 mm diameter can be detected using this technique. For each diameter, there needs would be separate values used for the sensing parameter. In other embodiments more sense elements than just two sense elements (inner and outer) can be added. Additional sense elements may increase the accuracy of detection from objects of multiple sizes, for example.

It should be noted that in the embodiments described herein discuss the capacitive button has having sense elements. The sense elements are electrodes disposed in various configurations and the self-capacitance of an electrode or a mutual capacitance between two electrodes can be measured to detect a conductive object proximate to the capacitive sense button. Sense elements are sometimes referred to as sensors, but it should be understood that the sensors do not include circuitry to measure the capacitance. Rather, capacitance-sensing circuit, which can also be referred to as a capacitance sensor, measures the capacitances of the sensors (herein referred to as electrodes or sense elements). Various embodiments described herein may be used in other touch sensing technologies than just capacitive buttons.

FIG. 1 illustrates a capacitive button 100 according to one implementation. Conventionally, implementation of the capacitive button 100 can be used to detect a touch from a conductive object. The capacitive button 100 can include a capacitive sense element 102 that can be tuned by a touch controller (not illustrated in FIG. 1) to detect a touch by a conductive object of a specific size or dimension. That is a sensing parameter, such as sensitivity of measurements of the capacitive sense element 102 can be programmed for an expected size of conductive objects to be interacting with the capacitive button 100. Although this sensing parameter may be tunable to detect different sizes of conductive objects for different applications, such as to detect fingers or to detect styli. That is the touch controller is programmed with one sensitivity value before operation to detect fingers and the touch controller can also be programmed with another sensitivity value before operation to detect styli. It was not possible with the conventional touch controller to effectively detect and differentiate touches from conductive objects with two different sizes and dimensions. For example, it is not possible to efficiently detect and differentiate touches from a human finger, typically has 10 mm diameter, and touches from small conductive objectives like 3 mm stylus, these solutions have various limitations to accommodate both types of touches. Styli can be other diameters like 4 mm, 3 mm, or 1 mm. The capacitive button 100 includes an optional hole 103 used for backlight. The capacitive button 100 is disposed within a touch area 205. Today, users frequently operate devices with capacitive technologies both with their fingers and a stylus. Currently, the only method to detect touches from both smaller conductive objects from bigger conductive objects is to make the capacitance-sensing circuit to be more sensitive to detect the touches from both big and small conductive objects. This may create false touches or a "hover effect" for touches from larger conductive objects. For example, making a sense element have very high sensitivity to detect touches from smaller objects makes the sense element extremely sensitive to touches from bigger fingers, creating a "hover" effect for bigger fingers. This may reduce the immunity of the sense element to external noises and can create false touches in presence of external noises. As such, making the sense element to have higher sensitivity can only be used to detect touches from small conductive objects, but it cannot differentiate touches from small and big fingers.

Figure 2:
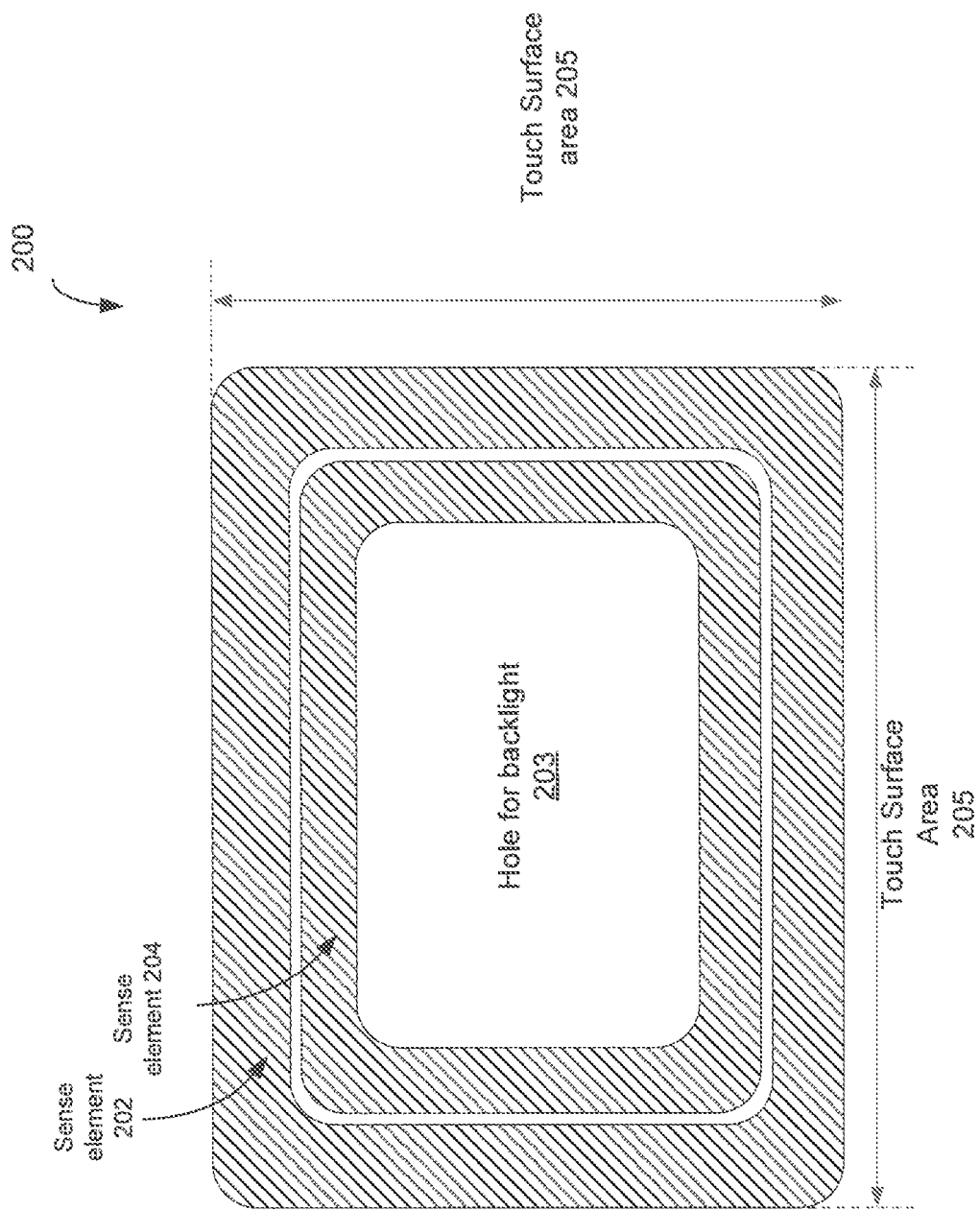
FIG. 2 illustrates a capacitive button according to one embodiment.

FIG. 2 illustrates a capacitive button 200 according to one embodiment. The capacitive button 200 includes a first sense element 202 and a second sense element 204 that can be used to detect a conductive object proximate to the capacitive button 200. The capacitive button 200 includes an optional hole 203 used for an optional backlight. In other embodiments, different size objects can be detected with or without the optional hole 203. The capacitive button 200 is disposed within a touch area 205. In this embodiment, the touch area 205 (or a physical sense element such as sense element 102 previously used in the touch area 105) is split into two different sense elements 202, 204. The capacitive button 200 can be used in connection with a touch controller, such as a processing device including a capacitance-sensing circuit and processing logic, to detect and differentiate between touch objects with different sizes and dimensions. The first sense element 202 is considered an outer sense element (or outer electrode) and the second sense element 204 is considered an inner sense element 204 (or inner electrode). An inner perimeter of the first sense element 202 is disposed to surround, at least in part or in whole, an outer perimeter of the second sense element 204. These sense elements 202, 204 are connected to two sense pins (or terminals or inputs) of a capacitive touch controller (not illustrated in FIG. 2). As described in more detail below, a signal produced by the outer sense element 202 is used detect size of a touch object, as well as to dynamically modify one or more tuning parameters used by the capacitive touch controller to measure signals on the inner sense element 204. The inner sense element 204 is used to detect touches from a larger conductive object like a finger. Then, based on the signal produced by the outer sense element 202, the one or more tuning parameters of the capacitive touch controller to measure signals on the inner sense element 202 are dynamically modified to detect and differentiate touches by larger and smaller conductive objects, such as fingers and styli. In other embodiments, both sense elements 202, 204 can be used together to track the touches by the larger conductive objects once a large conductive object is differentiated from a smaller conductive object. Similarly, once a smaller object is differentiated, both sense elements 202, 204 can be used together to track touches by the smaller conductive object. In other embodiments, additional sense elements than two sense elements can be used to detect different types of conductive objects (e.g., between finger and stylus or between big finger and smaller finger). For example, self-capacitance measurements of more than two sense elements can be used to detect and differentiate multiple finger sizes with more accuracy.

The outer sense element 202 and inner sense element 204 can be conductive materials like copper, indium tin oxide (ITO), carbon, silver or the like. The outer sense element 202 and inner sense element 204 can be constructed on a printed circuit board (PCB), a touch screen, plexi-glass, or the like.

Using the capacitive button 200, the touch controller can measure self-capacitance of the outer sense element 202 and inner sense element 204. In other embodiments, the touch controller can measure mutual capacitance of a capacitive button, such as illustrated and described with respect to FIG. 3.

Figure 3:
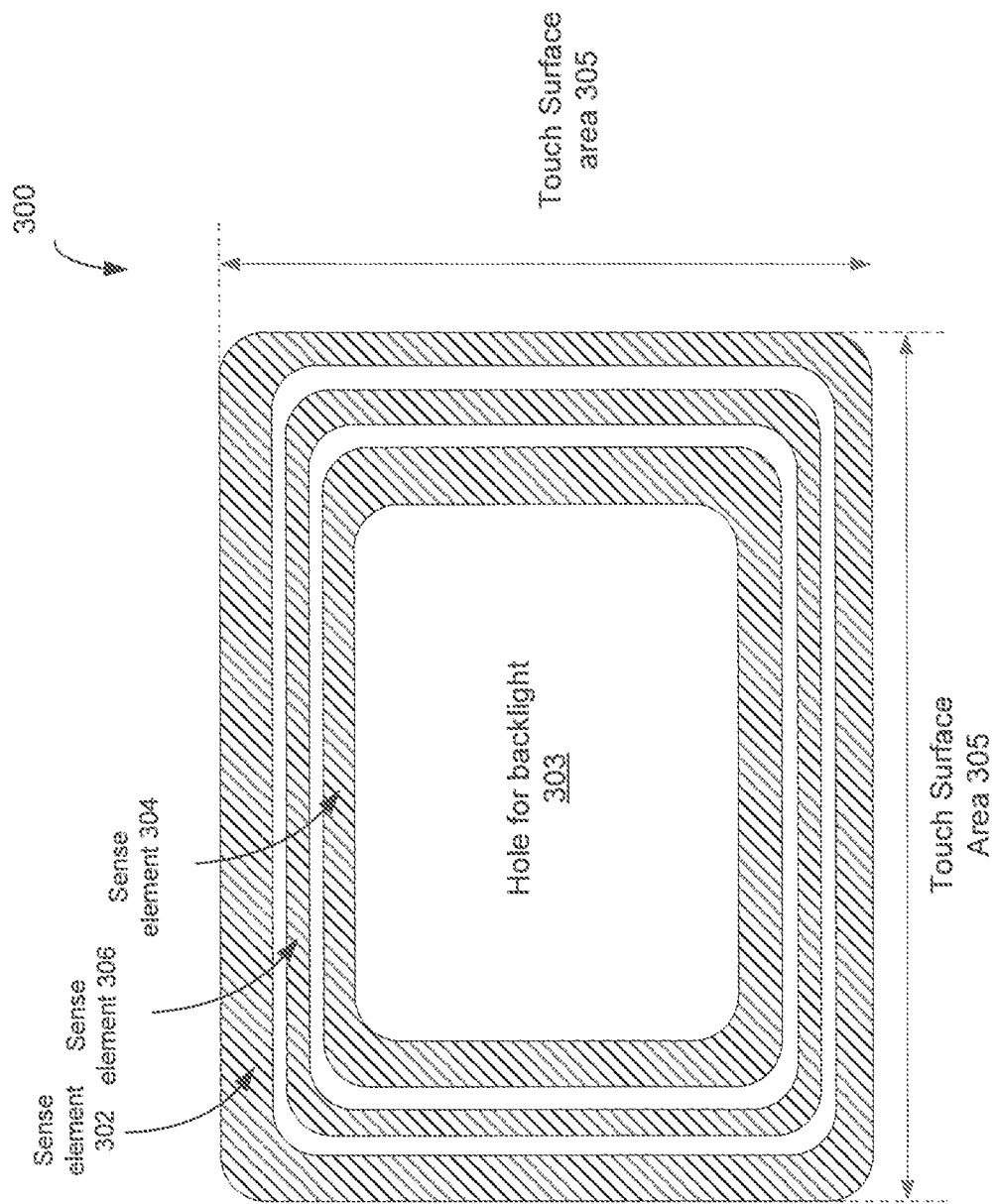
FIG. 3 illustrates a capacitive button according to another embodiment.

FIG. 3 illustrates a capacitive button 300 according to another embodiment. The capacitive button 300 includes a first sense element 302, a second sense element 304, and a third sense element 306 that can be used to detect a conductive object proximate to the capacitive button 300. The capacitive button 300 includes a hole 303 used for an optional backlight. The capacitive button 300 is disposed within a touch area 305. In this embodiment, the touch area 305 (or a physical sense element such as sense element 102 previously used in the touch area 105) is split into three different sense elements 302, 304, 306. The capacitive button 300 can be used in connection with a touch controller, such as a processing device including a capacitance-sensing circuit and processing logic, to detect and differentiate between touch objects with different sizes and dimensions. The first sense element 302 is considered an outer sense element (or outer electrode), the second sense element 304 is considered an inner sense element 304 (or inner electrode), and the third sense element 306 is considered a middle sense element 306 (or middle electrode). An inner perimeter of the first sense element 302 is disposed to surround, at least in part or in whole, an outer perimeter of the second sense element 304. The inner perimeter of the first sense element 302 is also disposed to surround an outer perimeter of the third sense element 306 and an inner perimeter of the third sense element 306 is disposed to surround the outer perimeter of the second sense element 304. These sense elements 302, 304, 306 are connected to three sense pins (or terminals or inputs) of a capacitive touch controller (not illustrated in FIG. 3). The middle sense element 306 can be used by the touch controller as a transmit (TX) electrode for a TX drive signal and the outer sense element 302 and the inner sense element 304 can be used by the touch controller as receive (RX) electrodes to measure RX signals on the RX electrodes caused by the TX signal applied to the TX electrode. As described in more detail below, a signal produced by the outer sense element 302 is used detect size of a touch object, as well as to dynamically modify one or more tuning parameters used by the capacitive touch controller to measure signals on the inner sense element 304. The inner sense element 304 is used to detect touches from a larger conductive object like a finger. Then, based on the signal produced by the outer sense element 302, the one or more tuning parameters of the capacitive touch controller to measure signals on the inner sense element 302 are dynamically modified to detect and differentiate touches by larger and smaller conductive objects, such as fingers and styli. In other embodiments, both sense elements 302, 304 can be used together to track touches by the larger conductive objects once a large conductive object is differentiated from a smaller conductive object. Similarly, once a smaller object is differentiated, both sense elements 302, 304 can be used together to track touches by the smaller conductive object.

The outer sense element 302, inner sense element 304, and middle sense element 306 can be conductive materials like copper, ITO, carbon, silver or the like. The outer sense element 302, inner sense element 304, and middle sense element 306 can be constructed on a PCB, a touch screen, plexi-glass, or the like.

Using the capacitive button 300, the touch controller can measure a mutual capacitance between the middle sense element 306 and outer sense element 302 and a mutual capacitance between the middle sense element 306 and inner sense element 304. In other embodiments where two sense elements (instead of three sense elements) are used, the touch controller can also measure a mutual capacitance between the two sense elements in connection with measuring the self-capacitance of the two sense elements.

There are two types of capacitive sensing methods, mutual capacitive sensing and self-capacitance sensing, that can be used for measuring capacitance(s) of the capacitive buttons 200, 300. When implementing the capacitive button solution using self-capacitance sensing, only two electrodes are used (inner and outer). The outer sense element may be big in size, as compared to the inner sense element. When a finger (big finger) approaches the button touch area, the outer sense element produces a large signal as finger covers the complete area of outer sense element electrode. When button is touched using smaller conductive object, like a smaller finger or a stylus, no area of the outer sense element is covered by the small finger (or stylus); therefore, no signal or a smaller signal is produced on the outer sense element when the capacitive button is touched by small finger. The tuning properties of inner sense element are modified based on the signal produced by outer sense element to detect a touch. When there is no signal or a small signal produced by outer sense element electrode, the inner sense element is tuned to detect touches from the smaller finger (or stylus). When the outer sense element produces a large signal, the large signal indicates a presence of larger finger; therefore, tuning properties of inner sense element is modified to detect touches of big finger.

When implementing the capacitive button solution using mutual capacitance sensing, three electrodes are used for sensing, including one transmit electrode and two receive electrodes. In some embodiments, such as illustrated in FIG. 3, the transmit electrode is a middle electrode disposed between an outer electrode and an inner electrode. The outer electrode is placed around the transmit electrode and the transmit electrode is placed around the inner electrode.

The embodiments described herein implement detection of different size conductive objects, such as different sizes of fingers. The embodiments described herein implement detection of different types of conductive objects based on size. That is the embodiments implement detection and differentiation of a finger touch from a stylus touch as described herein. Touches from a small finger may be detected by tuning at least one of the sense elements to a higher sensitivity. Tuning the sense element makes the sense element more sensitive to touches by conductive objects proximate to the capacitive button. A sense element with very high sensitivity can detect the touches from smaller objects, such as a smaller finger or a stylus.

The embodiments described herein can provide various advantages or benefits as the conventional solutions. For example, the touches from stylus and touches from smaller human fingers can be detected without making the sense element overly sensitive for touches from larger human fingers. The embodiments may also avoid a "hover" effect on a capacitive button while implementing stylus and finger touches. The embodiments may avoid or greatly reduces the probability for false touches from a capacitive button when it is tuned for higher sensitivity to detect smaller fingers. The embodiments may enable detection of touches from multiple sizes of fingers, like 10 mm or larger human finger, 3 mm stylus and 1 mm stylus. The embodiments can be used to not only detect touches by big and small fingers, but also differentiate between touches by big and small fingers and report that detected touch on the capacitive button was by a big or small finger. There is no additional material cost for the embodiments described herein to detect touches and differentiate those touches as being by a stylus and a finger. Also, the embodiments described herein can be implemented using existing touch controllers. It should be noted that touch controllers in the embodiments above measure capacitance(s) of the capacitive button. In other embodiments, other circuitry can be used to measure the capacitance(s) of the capacitive button. In one embodiment, a processing device, including a capacitance-sensing circuit and processing logic, can be used to measure capacitances as described herein and differentiate between touches by larger conductive objects and smaller conductive objects.

The embodiment described herein, as compared to conventional solutions, can offer finger and passive stylus touch detection on capacitive buttons without additional cost or system-level implementation complications. Providing the passive stylus detection and on capacitive button may provide seamless user interface experience for users. The embodiments described herein can be used in touch screen applications, as well as in other touch sensitive interfaces. For example, the capacitive buttons and corresponding method of operating the same can be implemented in products that are operated using finger and stylus. Examples for such products may include touchscreen smart phones, tablets, mobile phones, media devices, game consoles, or other consumer electronics. The embodiments described herein may also be used in control panels of various devices, including appliances. For example, a control panel can differentiate between a smaller finger, such as that of a child, from a larger finger for safety purposes. Also, the ability to differentiate between different size touches can be used in other applications, where a device performs different operations based on the different size of touches detected. These embodiments can be used in any device to enable the stylus and finger detection on one or more capacitive buttons. This may permit the devices to have a better, intuitive user interface experience, as well as create more design possibilities for these types of devices, especially mobile devices. In other embodiments, the self-capacitance measurement and mutual-capacitance measurements, such as described with respect to FIGS. 2 and 3, can be used to implement a water tolerance solution. For example, each sense element (inner and outer) can be configured as self-capacitance sense elements to be used to detect finger or stylus. Then one of the two sense elements can be configured as a TX electrode (inner or outer) and the other one of the two sense elements can be configured to be an RX electrode and a mutual capacitance between the TX electrode and the RX electrode can be measured. The self-capacitance measurement can be used to detect different size fingers and stylus. A water droplet (which is an ungrounded conductor) has different signal profiles for self-capacitance measurement and for mutual capacitance measurement. This difference in signal profile can be used to detect and differentiate between whether water or finger is present on the sense elements, and the self-capacitance measurements can be used to identify whether the object is a finger or a stylus as described herein.

The embodiments described herein may also be used to detect and differentiate touches from different types of touch objects, such as a touch from a bare finger and a touch from a finger covered in a glove. For example, a stylus has small tip and touches the sensor on very limited area, as compared to a gloved finger that has as large area. However, the glove finger produces a smaller signal than the finger without a glove. So the signal amplitude and pattern for a stylus, gloved finger and finger (without glove) will be different for each. The stylus may also result in a small amount of signal on the inner sense element and very small or no signal on the outer sense element. A gloved finger, however, results in a small amount of signal on both inner and outer sense elements because the gloved finger covers both the inner and outer sense elements, as compared to a stylus that does not cover both. A finger without a glove results in a larger amount of signal on inner sense element, as well as on the outer sense element, as compared to the signal produced by the gloved finger. Also, in other embodiments, two or more sense elements can be ganged together to form one larger sense element for different purposes.

Figure 4:
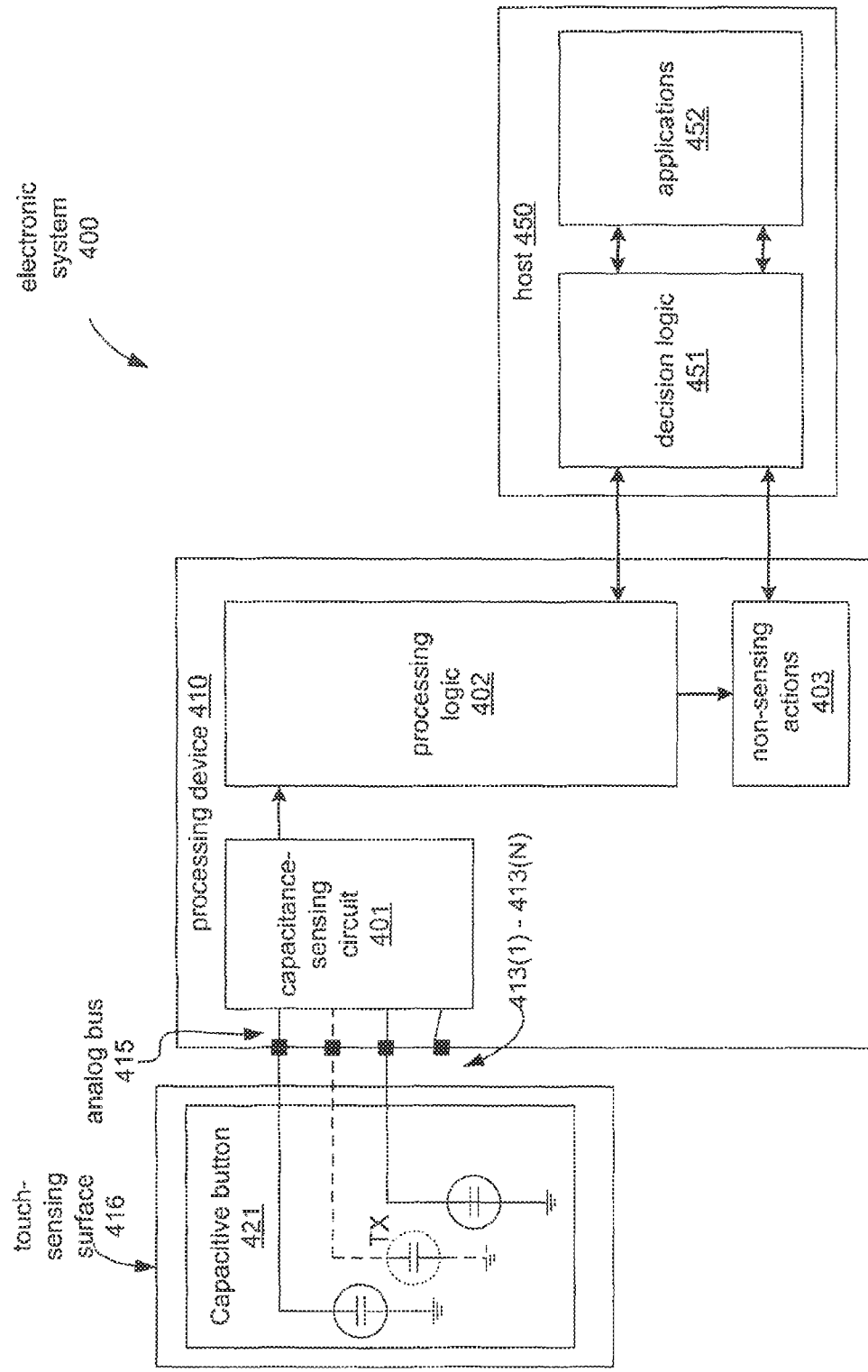
FIG. 4 illustrates a block diagram of one embodiment of an electronic system 400 including a processing device that may be configured to measure capacitances of a capacitive button 421.

FIG. 4 illustrates a block diagram of one embodiment of an electronic system 400 including a processing device 410 that may be configured to measure capacitances of a capacitive button 421. The electronic system 400 includes a capacitive button 421 coupled to the processing device 410. The capacitive button 421 may be the capacitive button 200 or the capacitive button 300. The processing device is coupled to a host 450. In one embodiment, a multiplexer circuit may be used to connect a capacitance-sensing circuit 401 of the processing device 410 with a capacitive button 421. In one embodiment, the capacitive button 421 is disposed in connection a touch-sensing surface 416 of the electronic system 400. The electrodes of the capacitive button 421 can be disposed beneath an overlay, cover of the device, or the like. As described herein, the capacitive button 421 can include two electrodes, such as for self-capacitance sensing embodiments, or can include three electrodes, such as for mutual capacitance sensing embodiments. The capacitive button 421 may also be one of many capacitive buttons.

The electrodes of the capacitive button 421 are coupled to pins 413(1)-413(N) of the processing device 410 via one or more analog buses 415 transporting multiple signals. In an alternative embodiment without an analog bus, each pin may instead be connected either to a circuit that generates a transmit (TX) signal or to an individual receive (RX) channel of the capacitance-sensing circuit. The capacitive button 421 may be disposed to have a flat surface profile. Alternatively, the capacitive button 421 may have non-flat surface profiles. Alternatively, other configurations, layout, combinations of one or more capacitive buttons may be used. In one embodiment, the capacitive button 421 may be included in an ITO panel or a touch screen panel. In other embodiments, the capacitive button 421 can be implemented separate from the ITO panel or touch screen.

In one embodiment, the capacitance-sensing circuit 401 may include a relaxation oscillator or other means to convert a capacitance into a measured value. The capacitance-sensing circuit 401 may also include a counter or timer to measure the oscillator output. The processing device 410 may further include software components to convert the count value (e.g., capacitance value) into a touch detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance-sensing circuit 401 may be evaluating other measurements to determine the user interaction. For example, in the capacitance-sensing circuit 401 having a sigma-delta modulator, the capacitance-sensing circuit 401 is evaluating the ratio of pulse widths of the output (i.e., density domain), instead of the raw counts being over or under a certain threshold.

In another embodiment, the capacitance-sensing circuit 401 includes a TX signal generator to generate a TX signal to be applied to the TX electrode and a receiver (also referred to as a sensing channel), such as an integrator, coupled to measure an RX signal on the RX electrode. In a further embodiment, the capacitance-sensing circuit includes an analog-to-digital converter (ADC) coupled to an output of the receiver to convert the measured RX signal to a digital value (capacitance value). The processing device 410, the host 450 or both, can further process the digital value.

The processing device 410 is configured to detect one or more touches on one or more of the capacitive button(s) 421. The processing device 410 can detect conductive objects, such as touch objects (fingers or passive styluses, an active stylus, or any combination thereof). The capacitance-sensing circuit 401 can measure touch data on the capacitive button 421. In some cases, the capacitive button 421 can be considered a unit cell of one or more electrodes. In some cases, a unit cell is the electrode itself. In other cases, a unit cell is an intersection between two or more electrodes. For example, when multiple electrodes are measured, the touch data may be represented as multiple cells, each cell representing an intersection of sense elements (e.g., electrodes) of the capacitive button 421. An intersection between two sense elements may be understood as a location at which one sense electrode crosses over or overlaps another, while maintaining galvanic isolation from each other. The capacitive sense elements are electrodes of conductive material, such as copper. The sense elements may also be part of an ITO panel. The capacitive sense elements can be configurable to allow the capacitance-sensing circuit 401 to measure self-capacitance, mutual capacitance, or any combination thereof.

In another embodiment, the processing device 410 is a microcontroller that obtains a capacitance touch signal data set, and finger detection firmware executing on the microcontroller identifies data set areas that indicate touches, detects and processes peaks, calculates the coordinates, differentiates between smaller and larger touches, or any combination therefore. The microcontroller can report the precise coordinates to a host processor 450, as well as other information.

In one embodiment, the processing device 410 further includes processing logic 402. Operations of the processing logic 402 may be implemented in firmware; alternatively, they may be implemented in hardware or software. The processing logic 402 may receive signals from the capacitance-sensing circuit 401, and determine the state of the capacitive button 421, such as whether an object (e.g., a finger) is detected on or in proximity to the capacitive button 421 (e.g., determining the presence of the object), or other information related to an object detected at the capacitive button 421. For example, the processing logic 402 can differentiate between touches by smaller and larger conductive objects as described herein. In one embodiment, the processing logic 402 is processing logic that can be programmed to perform various functions.

In another embodiment, instead of performing the operations of the processing logic 402 in the processing device 410, the processing device 410 may send the raw data or partially processed data to the host 450. The host 450, as illustrated in FIG. 4, may include decision logic 451 that performs some or all of the operations of the processing logic 402. Operations of the decision logic 451 may be implemented in firmware, hardware, software, or a combination thereof. The host 450 may include a high-level Application Programming Interface (API) in applications 452 that perform routines on the received data, such as compensating for sensitivity differences, other compensation algorithms, baseline update routines, start-up and/or initialization routines, interpolation operations, or scaling operations. The operations described with respect to the processing logic 402 may be implemented in the decision logic 451, the applications 452, or in other hardware, software, and/or firmware external to the processing device 410. In some other embodiments, the processing device 410 is the host 450.

In another embodiment, the processing device 410 may also include a non-sensing actions block 403. This block 403 may be used to process and/or receive/transmit data to and from the host 450. For example, additional components may be implemented to operate with the processing device 410 along with the capacitive button 421 (e.g., keyboard, keypad, mouse, trackball, LEDs, displays, or other peripheral devices).

As illustrated, capacitance-sensing circuit 401 may be integrated into processing device 410. Capacitance-sensing circuit 401 may include analog I/O for coupling to an external component, such the capacitive button 421, and/or touch-sensor pad (not shown), touch-sensor slider (not shown), touch-sensor buttons (not shown), touch screen and/or other devices. The capacitance-sensing circuit 401 may be configurable to measure capacitance using mutual-capacitance sensing techniques, self-capacitance sensing technique, charge coupling techniques, or the like. In one embodiment, capacitance-sensing circuit 401 operates using a charge accumulation circuit, a capacitance modulation circuit, or other capacitance sensing methods known by those skilled in the art. In an embodiment, the capacitance-sensing circuit 401 is of the Cypress TMA-3xx, TMA-4xx, or TMA-xx families of touch screen controllers. Alternatively, other capacitance-sensing circuits may be used.

The capacitive button 42 may include may include a portion (or all) that is transparent and disposed on, in, or under either a visual display itself (e.g. LCD monitor), or a transparent substrate in front of the display.

When a touch object, such as a finger or stylus, approaches the capacitive button 421, the object causes a decrease in mutual capacitance between some of the TX/RX electrodes. In another embodiment, the presence of a finger increases the coupling capacitance of the electrodes. For example, in self-capacitance sensing, the self-capacitance may increase when a touch object approaches the capacitive button 42a.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 410 may also be done in the host.

The processing device 410 may reside on a common carrier substrate such as, for example, an integrated circuit (IC) die substrate, or a multi-chip module substrate. Alternatively, the components of the processing device 410 may be one or more separate integrated circuits and/or discrete components. In one embodiment, the processing device 410 may be the Programmable System on a Chip (PSoC®) processing device, developed by Cypress Semiconductor Corporation, San Jose, Calif. Alternatively, the processing device 410 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 410 may be a network processor having multiple processors including a core unit and multiple micro-engines. Additionally, the processing device 410 may include any combination of general-purpose processing device(s) and special-purpose processing device(s).

Capacitance-sensing circuit 401 may be integrated into the IC of the processing device 410, or alternatively, in a separate IC. Alternatively, descriptions of capacitance-sensing circuit 401 may be generated and compiled for incorporation into other integrated circuits. For example, behavioral level code describing the capacitance-sensing circuit 401, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 404.

It should be noted that the components of electronic system 400 may include all the components described above. Alternatively, electronic system 400 may include some of the components described above.

In one embodiment, the electronic system 400 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to capacitive buttons in touch-sensitive interfaces, but can be used in other capacitive sensing implementations. For example, the capacitive button can be used in connection with any sensing device, such as a touch screen, touch pad, touch-sensor slider (not shown) or a panel of touch-sensor buttons. In one embodiment, these sensing devices include one or more capacitive sensors or other types of capacitance-sensing circuitry. The operations described herein are not limited to device button operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

In another embodiment, the processing device 410 is coupled to a capacitive button 421 includes at least two electrodes disposed such that an inner perimeter of a first electrode of the at least two electrodes at least partially surrounds an outer perimeter of a second electrode of the at least two electrodes. The processing device 410 is operative to detect a combination of activations of the first electrode and the second electrode caused by a conductive object proximate to the capacitive button 421. The processing device 410 distinguishes between a first type of conductive object and a second type of conductive object based on the combination of activations. The combination of activations may include a combination of measured signals from the first electrode and the second electrode. The combination of measured signals may be the result of self-capacitance measurements of the first electrode and the second electrode. In another embodiment, the processing device is further operative to apply a first drive signal to a third electrode of the at least two electrodes of the capacitive button. In this case, the combination of activations includes a combination of measured signals from the first electrode and the second electrode. The combination of measured receive signals may be the result of mutual-capacitance measurements between the third electrode and the first electrode and between the third electrode and the second electrode. In one embodiment, an inner perimeter of the third electrode at least partially surrounds the outer perimeter of the second electrode and the inner perimeter of the first electrode at least partially surrounds an outer perimeter of the third electrode.

In one embodiment, the processing device includes a capacitance-sensing circuit coupled to the first electrode and the second electrode, such as capacitance-sensing circuit 401. The capacitance-sensing circuit is operative to measure a first self-capacitance of the first electrode and a second self-capacitance of the second electrode. The processing device 410 is operative to compare the first and second self-capacitances against one or more thresholds to detect the combination of activations. In another embodiment, the processing device 410 is coupled to the three electrodes and the capacitance-sensing circuit is operative to measure a first mutual capacitance between the third electrode and the first electrode and a second mutual capacitance between the third electrode and the second electrode. The processing device 410 is operative to compare the first and second mutual capacitances against one or more thresholds to detect the combination of activations.

Figure 5:
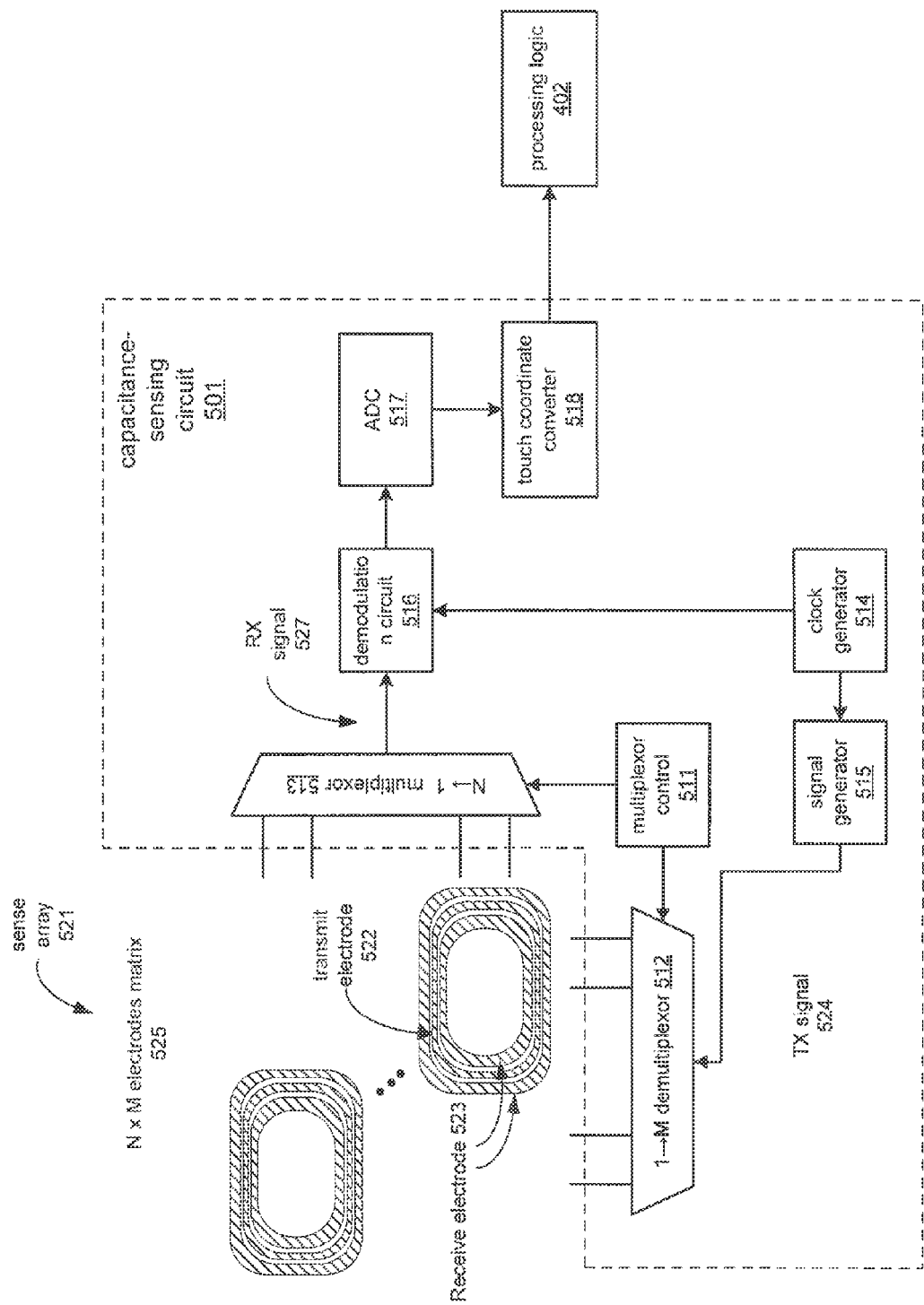
FIG. 5 is a block diagram illustrating another embodiment of an electronic system that processed touch data of a capacitive button.

FIG. 5 is a block diagram illustrating another embodiment of an electronic system 500 that processed touch data of a capacitive button in a capacitive sense array 521. The capacitive sense array 521 include N×M electrode matrix including multiple capacitive buttons. A capacitance-sensing circuit 501 may measure mutual capacitances for intersections between the transmit and receive electrodes in the respective capacitive buttons of the sense array 521. The activations of the capacitive buttons are calculated based on changes in the measured capacitances relative to the capacitances of the same touch capacitive button in an un-touched state. In one embodiment, capacitive sense array 521 and capacitance-sensing circuit 501 are implemented in a system or device such as electronic system 400. Capacitive sense array 521 includes a matrix 525 of N×M capacitive buttons, with each capacitive button including and one TX electrode 522 and two RX electrodes 523. The electrodes in the matrix are connected with capacitance sensing circuit 501 through demultiplexer 512 and multiplexer 513. That is the TX electrodes can be connected to the demultiplexer 512 and the RX electrodes can be coupled to the multiplexer 513 to permit multiple electrodes to be driven or sensed by the capacitance-sensing circuit 501.

Capacitance-sensing circuit 501 includes multiplexer control 511, demultiplexer 512, multiplexer 513, clock generator 514, signal generator 515, demodulation circuit 516, and analog to digital converter (ADC) 517. ADC 517 is further coupled with touch coordinate converter 518. Touch coordinate converter 518 may be implemented in the processing logic 402.

The transmit and receive electrodes in the electrode matrix 525 may be arranged so that each of the transmit electrodes 525 overlap and cross each of the receive electrodes such as to form an array of intersections, while maintaining galvanic isolation from each other. Thus, each transmit electrode may be capacitively coupled with each of the receive electrodes. For example, transmit electrode 522 is capacitively coupled with two receive electrode 523 at the point where transmit electrode 522 and receive electrodes 523 overlap.

Clock generator 514 supplies a clock signal to signal generator 515, which produces a TX signal 524 to be supplied to the transmit electrode 522 of touch capacitive button. In one embodiment, the signal generator 515 includes a set of switches that operate according to the clock signal from clock generator 514. The switches may generate a TX signal 524 by periodically connecting the output of signal generator 515 to a first voltage and then to a second voltage, where said first and second voltages are different.

The output of signal generator 515 is connected with demultiplexer 512, which allows the TX signal 524 to be applied to any of the M transmit electrodes of capacitive buttons. In one embodiment, multiplexer control 511 controls demultiplexer 512 so that the TX signal 524 is applied to each transmit electrode 522 in a controlled sequence. Demultiplexer 512 may also be used to ground, float, or connect an alternate signal to the other transmit electrodes to which the TX signal 524 is not currently being applied. In an alternate embodiment the TX signal 524 may be presented in a true form to a subset of the transmit electrodes 522 and in complement form to a second subset of the transmit electrodes 522. There may be no overlap in members of the first and second subset of transmit electrodes 522.

Because of the capacitive coupling between the transmit and receive electrodes, the TX signal 524 applied to each transmit electrode induces a current within each of the receive electrodes. For instance, when the TX signal 524 is applied to transmit electrode 252 through demultiplexer 512, the TX signal 524 induces an RX signal 527 on the receive electrodes in matrix 525. The RX signal 527 on each of the receive electrodes can then be measured in sequence by using multiplexer 513 to connect each of the N receive electrodes to demodulation circuit 516 in sequence.

The mutual capacitance associated with the intersections of all TX electrodes and RX electrodes can be measured by selecting every available combination of TX electrode and an RX electrode using demultiplexer 512 and multiplexer 513. To improve performance, multiplexer 513 may also be segmented to allow more than one of the receive electrodes in matrix 525 to be routed to additional demodulation circuits 516. In an optimized configuration, wherein there is a 1-to-1 correspondence of instances of demodulation circuit 516 with receive electrodes, multiplexer 513 may not be present in the system.

When a conductive object, such as a finger, approaches the electrode matrix 525, the object causes a decrease in the measured mutual capacitance between only some of the electrodes. For example, if a finger is placed near the intersection of transmit electrode 522 and receive electrode 523, the presence of the finger will decrease the charge coupled between electrodes 522 and 523. Thus, the location of the finger on the touchpad can be determined by identifying the one or more receive electrodes having a decrease in measured mutual capacitance in addition to identifying the transmit electrode to which the TX signal 524 was applied at the time the decrease in capacitance was measured on the one or more receive electrodes.

By determining changes in the mutual capacitances associated with each intersection of electrodes in the matrix 525, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitance-sensing circuit may introduce an additional capacitance to ground that increases the total capacitance between the electrode and ground. The location of the finger can be determined based on the locations of one or more electrodes at which a change in measured capacitance is detected, and the associated magnitude of capacitance change at each respective electrode.

Demodulation circuit 516 integrates the induced current signal 527. The rectified current output by demodulation circuit 516 can then be filtered and converted to a digital code by ADC 517.

A series of such digital codes measured from adjacent electrode intersections, when compared to or offset by the associated codes of these same electrodes in an un-touched state, may be converted to touch coordinates indicating a position of an input on touch capacitive button by touch coordinate converter 518. The touch coordinates may then be used to detect gestures or perform other functions by the processing logic 402.

For self-capacitance sensing, a sense element has capacitance associated with the sense element, which is referred as parasitic capacitance $C_P$. When finger touches sensing area, an additional capacitance is added to circuit due to the presence of human finger. This capacitance is referred as finger capacitance $C_F$. The total capacitance of sense element without finger presence is equal to $C_P$ of sense element and with presence, it is sum of $C_P$ and $C_F$. A capacitance-sensing circuit, such as a touch controller, implements a Capacitance-to-Digital Converter to convert the measured capacitances to digital values (also called digital counts). When there is a finger touch, there is an increase in the output of capacitance to count converter as illustrated in FIG. 6.

Figure 6:
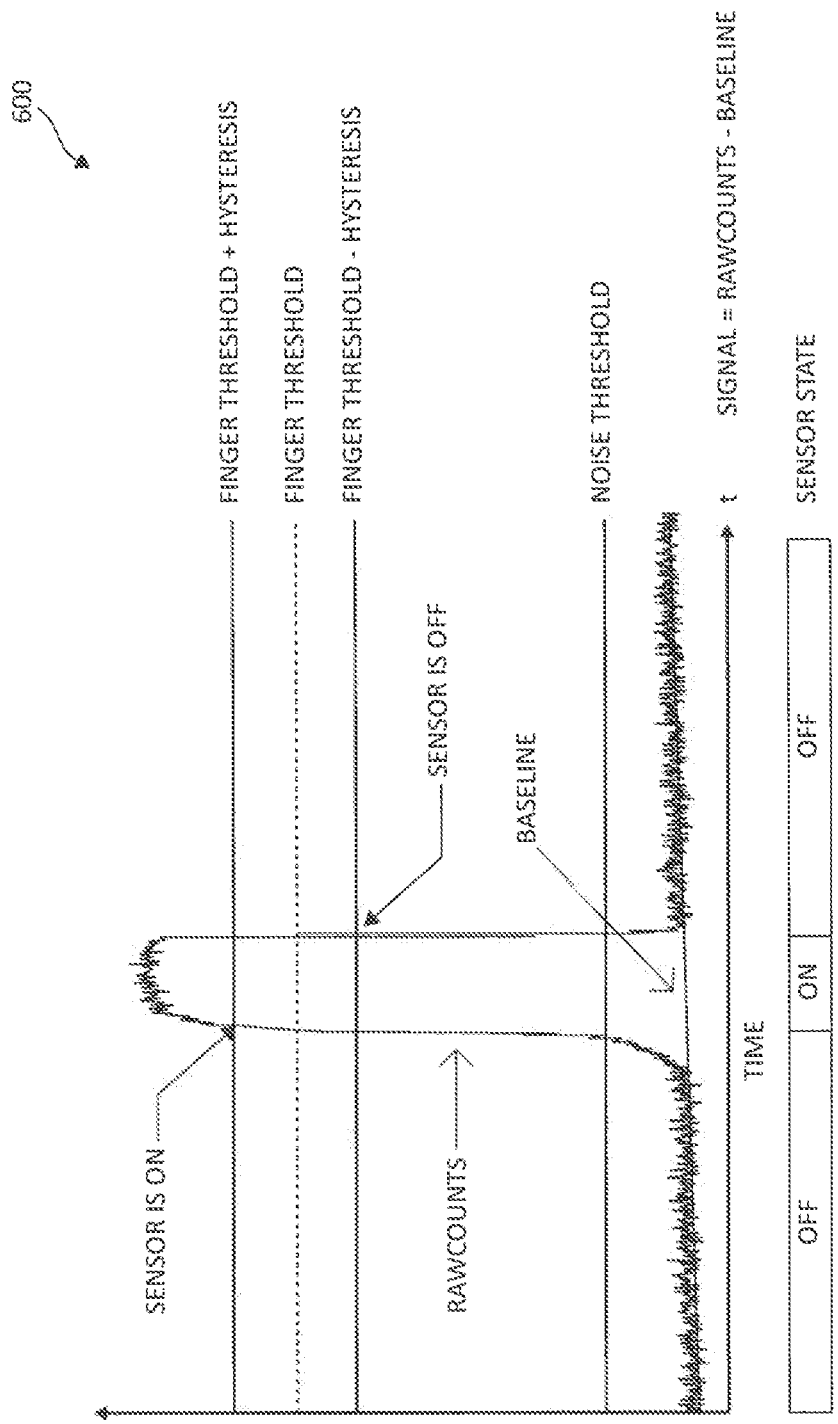
FIG. 6 illustrates capacitance output of digital converter with a finger touch according to one embodiment.

FIG. 6 illustrates capacitance output 600 of digital converter with a finger touch according to one embodiment. The raw counts are the digital values corresponding to the measured capacitances on the sense element. The baseline is initialized to raw counts at system start. Later, it slowly tracks raw counts if variation in raw counts is less than noise threshold. This feature helps to adapt to different environment conditions and avoid false touch detection. A signal is calculated by subtracting the baseline from raw counts. This represents capacitance added by finger touch. The finger threshold defines the increase in capacitance on sense element, which can be qualified as a valid touch. The finger threshold value can be changed dynamically as one of the tuning parameters as described herein.

The output of capacitance to 'digital count converter' is passed through a simple signal processing algorithms to detect increase in sense element capacitance due to finger touch. Firmware algorithms use this information to differentiate between an actual finger touch and spurious noise, such as any minimal capacitances induced by variance in temperature, pressure or other environmental factors. If the increase in sense element capacitance is more than a predetermined value (also called finger threshold), the touch controller declares presence of finger on the sense element. Capacitive sensing devices may use charge transfer and delta-sigma modulator based capacitance to digital conversion (referred as CSD) and charge transfer and successive approximation based sensing methods (referred as CSA). Alternatively, other methods of measuring capacitance can be used to convert capacitance to digital counts. Regardless of the conversion method, the embodiments described herein detect and differentiate touches from big and small fingers or stylus.

For mutual capacitance sensing, the capacitance that exists between two electrodes are measured using a capacitance to digital count converter sensing method. With finger presence, there is decrease in capacitance between two electrodes and the algorithm to detect finger presence measures the difference in capacitance.

Described bellow is a method that enables detection of small and big finger touches without the capacitive button being overly sensitive to big finger touches. This method requires different types of sense element construction and decision logic. A touch by small finger (e.g. touches from a stylus) and big finger (human finger) touch surface area of sense element shall produce a combination of signals from sense elements. The combination of signals can be used to differentiate or otherwise identify small and big finger touches. In the following method, it is assumed that 8 mm represents a big finger and 3 mm represents a stylus or a small finger.

Figure 7:
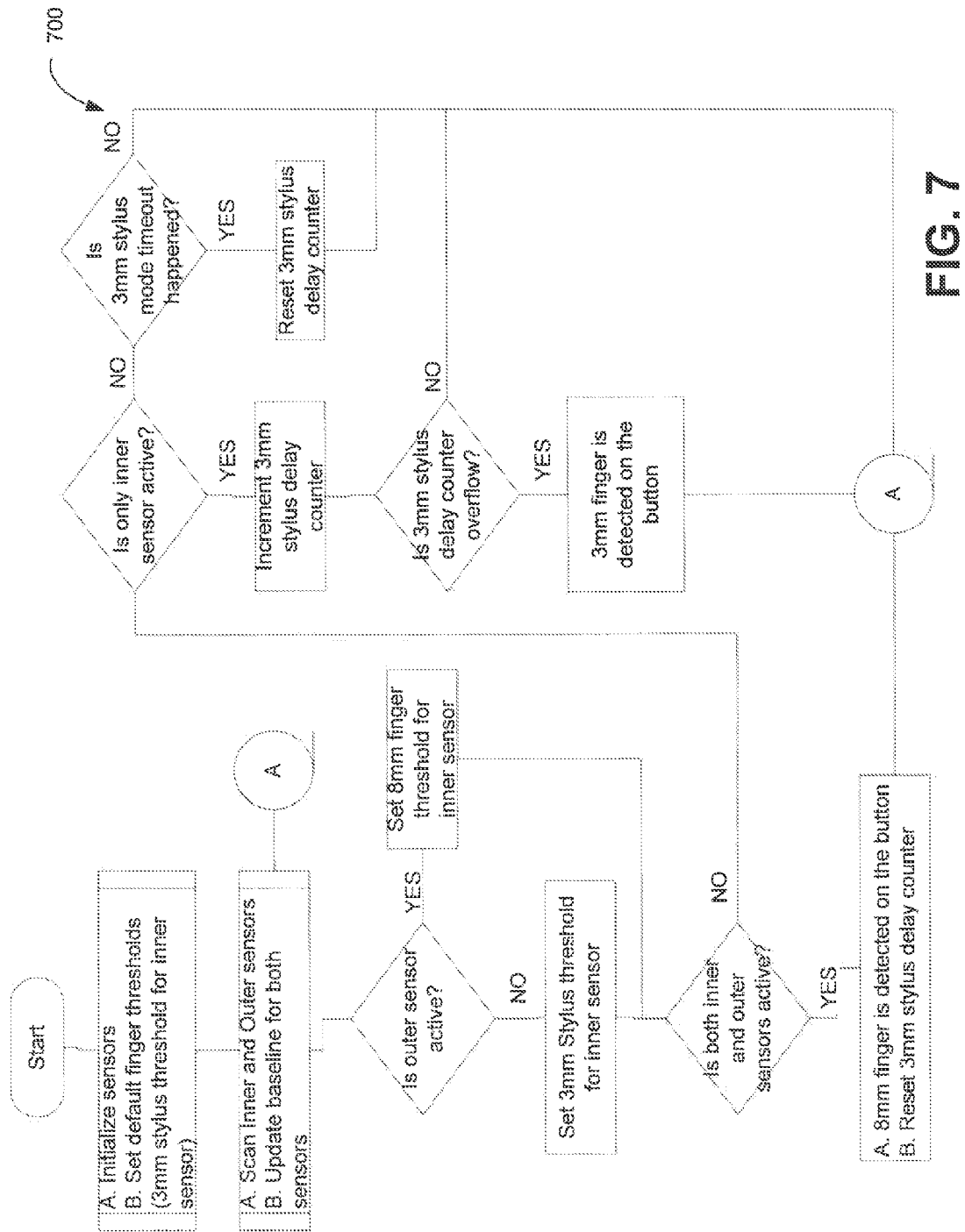
FIG. 7 is a flow diagram of a method of sensing a capacitive button according to one embodiment.

FIG. 7 is a flow diagram of a method of sensing a capacitive button according to one embodiment. The method 700 may be performed by processing logic that may include hardware (circuitry, dedicated logic, etc.), software (such as is run on a general purpose computing system or a dedicated machine), firmware (embedded software), or any combination thereof. In one embodiment, the processing device 410 of FIG. 4 performs some or all of method 700. In another embodiment, the processing logic 402 of FIG. 4 or FIG. 5 performs some or all of the operations of method 700. In other embodiments, the capacitance-sensing circuit 401 of FIG. 4, or the capacitance-sensing circuit 501 of FIG. 5, performs some of the operations of method 700. Alternatively, other components of the electronic system 400 of FIG. 4 perform some or all of the operations of method 700.

In FIG. 7, method 700 begins with the processing logic initializing sense elements and setting default finger thresholds (e.g., 3 mm stylus threshold for inner sense element) (block 702). The processing logic scans an inner sense element and an outer sense element and updates a baseline for both sense elements (block 704). The processing logic determines if the outer sense element is active (block 706). When the outer sense element is not active at block 706, the processing logic sets the 3 mm stylus threshold for the inner sensor element (block 708). However, when the outer sense element is active at block 706, the processing logic sets 8 mm finger threshold for inner sense element (block 710). At block 712, the processing logic determines if both inner and outer sense elements are active. When the processing logic determines that both inner and outer sense elements are active at block 712, the processing logic detects the 8 mm finger on the capacitive button (block 714) and returns to block 704. When the processing logic determines that both inner and outer sense elements are not active at block 712, the processing logic determines if only the inner sense element is active (block 716). If the inner sense element is active at block 716, the processing logic increments a 3 mm stylus delay counter (block 718). However, if the inner sense element is not active at block 716, the processing logic determines if a 3 mm stylus mode timeout happened (block 724). If the 3 mm stylus mode timeout did happen at block 724, the processing logic resets the 3 mm stylus delay counter and continues back to block 704. When the 3 mm stylus mode timeout happened, the processing logic continues to block 704. When the 3 mm stylus delay counter is incremented, the processing logic determines if the 3 mm stylus delay counter is in an overflow condition (block 720). When in overflow at block 720, the processing logic detects the 3 mm finger on the capacitive button (block 722); otherwise, the method 700 continues back to block 704.

In this embodiment, two sense elements can be used. In another embodiment, the method 700 scans three sense elements as described herein.

In another embodiment of a method, the processing logic measures signals from a first sense element and a second sense element of a capacitive button using a capacitance-sensing circuit programmed with a sensing parameter set to a first value. The signals correspond to capacitances of the first sense element and the second sense element. An inner perimeter of the first sense element is disposed to surround an outer perimeter of the second sense element. The processing logic detects, by processing logic whether a conductive object proximate to the capacitive button activates the first sense element based on the measured signals. The processing logic detects, by the processing logic, whether the conductive object proximate to the capacitive button activates the second sense element based on the measured signals. The processing logic adjusts, by the processing logic, the sensing parameter set to the first value to a second value when the second sense element is activated and the first sense element is not activated. The processing logic measures an additional signal from the second sense element using the capacitance-sensing circuit with the sensing parameter set to the second value when the second sense element is activated and the first sense element is not activated.

In a further embodiment, the processing logic measuring, by the capacitance-sensing circuit with the sensing parameter set to the first value, additional signals from the first sense element and the second sense element when the second sense element and the first sense element are activated.

In another embodiment, the measuring with the sensing parameter set to the first value or the second value includes measuring self-capacitances of the first sense element and the second sense element. Alternatively, the processing logic, by the capacitance-sensing circuit, applies or drives a first drive signal on a third sense element of the capacitive button. The measuring may be done with the sensing parameter set to the first value or the second value to measure a first mutual capacitance between the third sense element and the first sense element and a second mutual capacitance between the third sense element and the second sense element. The processing logic distinguishes between a first type of conductive object and a second type of conductive object using the processing logic based on the signals measured with the sensing parameter set to the first value. The conductive object is the first type when the second sense element is activated and the first sense element is not activated and the conductive object is the second type when the first sense element and the second sense element are activated. In another embodiment, the processing logic distinguishes between a stylus and a finger as the conductive object. The conductive object is the stylus when the second sense element is activated and the first sense element is not activated and the conductive object is the finger when the first sense element and the second sense element are activated. In another embodiment, the processing logic measures the signals from the first sense element and the second sense element using a first sensitivity and measures the additional signal using a second sensitivity. The first sensitivity is less than the second sensitivity. Alternatively, multiple activation thresholds can be used as the tuning parameters. Instead of changing the sensitivity of the capacitance-sensing circuit, the finger or stylus thresholds can be adjusted. In another embodiment, the processing logic measures the signals from the first sense element and the second sense element and compares the signals against a first activation threshold and measures the additional signal and compares the additional signal against a second activation threshold. The first activation threshold is higher than the second activation threshold.

Figure 8:
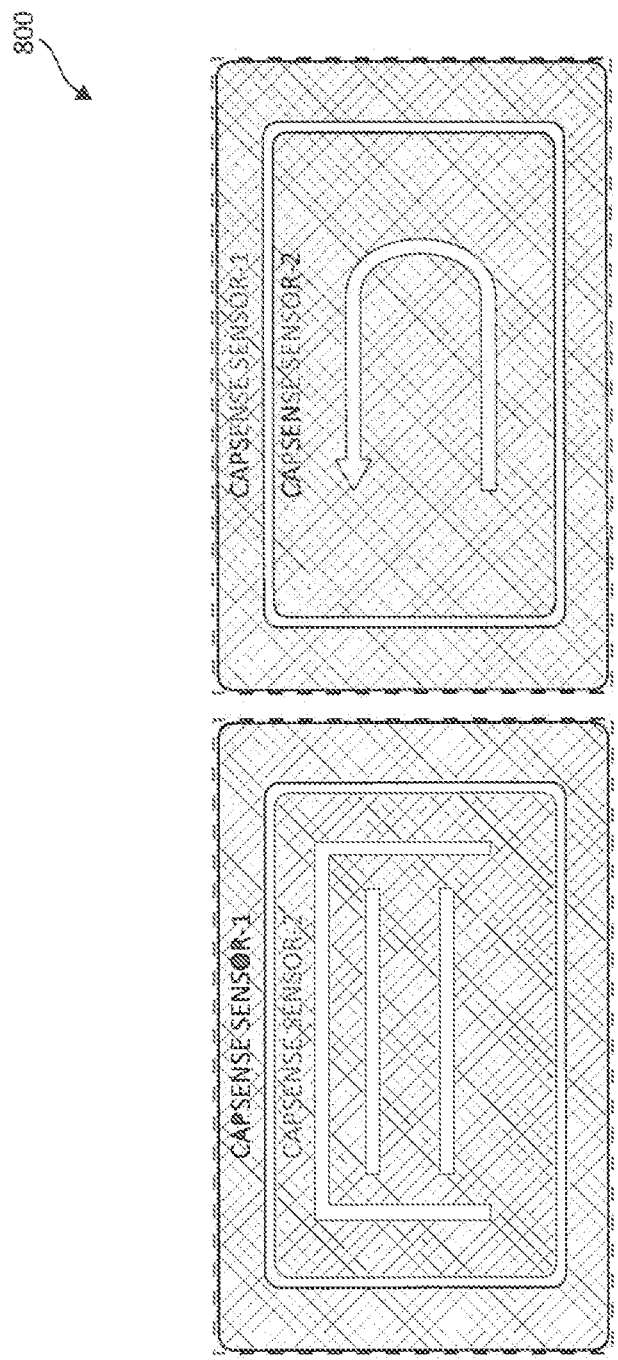
FIG. 8 illustrates two capacitive buttons according to another embodiment.

FIG. 8 illustrates two capacitive buttons 800 according to another embodiment. The two capacitive buttons 800 may be used as buttons on a mobile phone, as illustrated in FIG. 10.

Figure 9:
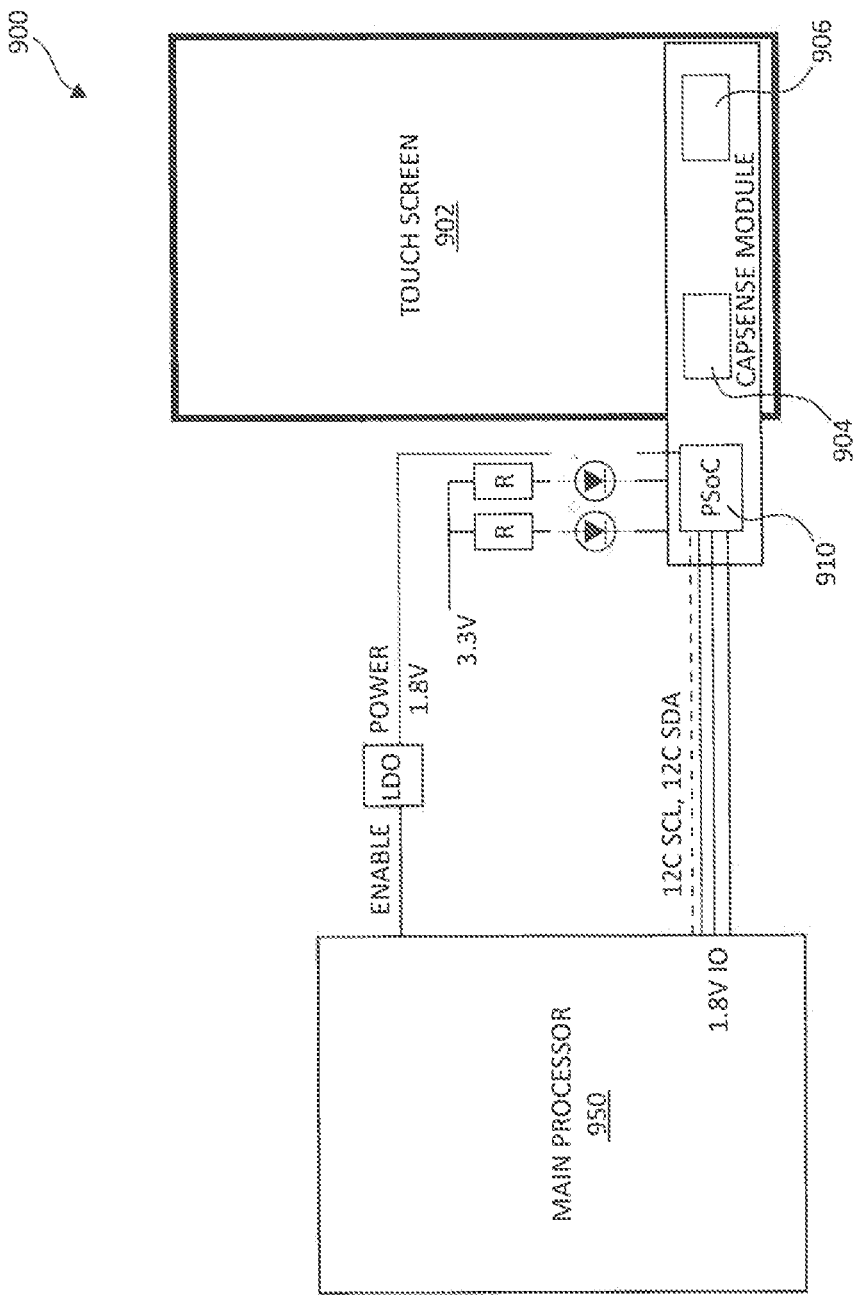
FIG. 9 is a block diagram of a mobile device with a touchscreen and two capacitive buttons according to one embodiment.

FIG. 9 is a block diagram of a mobile device 900 with a touchscreen 902 and two capacitive buttons 904, 906 according to one embodiment. The mobile device 900 also includes a host processor 950 and a processing device 910. The processing device 910 can be a touch controller that controls the touchscreen 902 in connection with the host processor 950. In addition, the processing device 910 can detect touches on capacitive buttons 904 and 906 as described herein.

Described herein is a new sense element layout for detecting and differentiating touches from big and small fingers or styli. The old sense element layout is illustrated in FIG. 1 and embodiments of the news sense element layout is illustrated in FIGS. 2, 3 and 8. Also, described herein is a new data processing algorithm for detecting and differentiating touches from big and small fingers or styli. One embodiment of this new data processing algorithm is illustrated in FIG. 7. The embodiments described herein have the ability to detect and differentiate touches from finger with smaller diameter and touches from finger with bigger diameter on a capacitive button, without making capacitive button overly sensitive to false touches from bigger fingers. The embodiments also have the ability to detect and differentiate human finger touch and passive stylus touch on a capacitive button. These embodiments can also avoid false touches caused by the hover effect on sense element when operating with big finger. The embodiments described herein may also have the ability to reject touches when human finger is not exactly on button. For example, an algorithm can accurately accept/reject when human finger is overlapping with button below certain percentage set in firmware, such as illustrated in Table 1 below.

Table 1 includes signal measurements from inner and outer sense elements:

| # | Input | Signal from outer sense element | Signal from inner sense element | Output of decision logic/algorithm |
|---|---|---|---|---|
| 1 | Big Finger, 25% touch (8 mm finger) | 75 | 20 | Reject - low signal inner sense element |
| 2 | Big Finger, 50% touch (8 mm finger) | 105 | 40 | Accept - good signal on inner and outer sense elements |
| 3 | Big Finger, 100% touch (8 mm finger) | 120 | 90 | Accept - good signal on inner and outer sense elements |
| 4 | Small Finger on outer sense element (3 mm stylus) | 45 | 20 | Reject - low signal from inner sense element |
| 5 | Small Finger on inner sense element (3 mm stylus) | 30 | 30 | Accept - good signal on inner and outer sense elements |
| 6 | Small Finger at center (3 mm stylus) | 35 | 30 | Accept - good signal on inner and outer sense elements |

In some embodiments, the tuning parameter can be dynamically changed to detect small and big fingers based on a host command. In this case, the end product of application needs "somehow need to know" whether user is operating the product with small of big finger. In other embodiments, the processing logic can automatically detect and differentiate the big and small finger touches without a command from host.

The processing logic can be implemented in a capacitive touch screen controller. In one embodiment, the capacitive touch screen controller is the TrueTouch® capacitive touch-screen controllers, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports leading operating systems, and is optimized for low-power multi-touch gesture and all-point touchscreen functionality. Alternatively, the touch position calculation features may be implemented in other touchscreen controllers, or other touch controllers of touch-sensing devices. In one embodiment, the touch position calculation features may be implemented with other touch filtering algorithms as would be appreciated by one of ordinary skill in the art having the benefit of this disclosure.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus comprising:
   a capacitance-sensing circuit coupled to a capacitive button comprising a first sense element and a second sense element, wherein the capacitance-sensing circuit is operative to measure signals from the first sense element and the second sense element with a sensing parameter set to a first value, wherein the signals correspond to capacitances of the first sense element and second sense element, and wherein an inner perimeter of the first sense element is disposed to surround an outer perimeter of the second sense element; and
   processing logic coupled to the capacitance-sensing circuit, wherein the processing logic is operative to:
      detect whether the first sense element is activated by a conductive object proximate to the capacitive button based on the measured signals;
      detect whether the second sense element is activated by the conductive object proximate to the capacitive button based on the measured signals; and
      adjust the first value to a second value for the sensing parameter when the second sense element is activated and the first sense element is not activated, wherein the capacitance-sensing circuit is operative to measure an additional signal from the second sense element with the sensing parameter set to the second value when the second sense element is activated and the first sense element is not activated and to measure additional signals from the first sense element and the second sense element with the sensing parameter set to the first value when the second sense element and first sense element are activated.

2. The apparatus of claim 1, wherein the capacitances are self-capacitances of the first sense element and the second sense element.

3. The apparatus of claim 1, wherein the capacitance-sensing circuit is operative to drive a first drive signal on a third sense element of the capacitive button, wherein the capacitances comprise a first mutual capacitance between the third sense element and the first sense element and a second mutual capacitance between the third sense element and the second sense element.

4. The apparatus of claim 3, wherein the inner perimeter of the first sense element is disposed to surround an outer perimeter of the third sense element and an inner perimeter of the third sense element is disposed to surround the outer perimeter of the second sense element.

5. The apparatus of claim 1, wherein the processing logic is operative to distinguish between a first type of conductive object and a second type of conductive object based on the signals measured with the sensing parameter set to the first value, wherein the conductive object is the first type when the second sense element is activated and the first sense element is not activated and the conductive object is the second type when the first sense element and the second sense element are activated.

6. The apparatus of claim 5, wherein the first type of conductive object is a stylus and the second type of conductive object is a finger.

7. The apparatus of claim 1, wherein the sensing parameter is a sensitivity of the capacitance-sensing circuit, wherein the first value is less than the second value.

8. An apparatus comprising:
a processing device coupled to a capacitive button comprising at least two electrodes disposed such that an inner perimeter of a first electrode of the at least two electrodes surrounds an outer perimeter of a second electrode of the at least two electrodes, wherein the processing device is operative to:
detect a combination of activations of the first electrode and the second electrode caused by a conductive object proximate to the capacitive button; and
distinguish between a first type of conductive object and a second type of conductive object based on the combination of activations,
wherein the processing device is operative to apply a first drive signal to a third electrode of the at least two electrodes of the capacitive button, wherein the combination of activations comprises a combination of measured receive signals from the first electrode and the second electrode, wherein the combination of measured receive signals are the result of mutual-capacitance measurements between the third electrode and the first electrode and between the third electrode and the second electrode.

9. The apparatus of claim 8, wherein an inner perimeter of the third electrode at least partially surrounds the outer perimeter of the second electrode and the inner perimeter of the first electrode at least partially surrounds an outer perimeter of the third electrode.

10. The apparatus of claim 8, wherein the processing device comprises a capacitance-sensing circuit coupled to the first electrode and the second electrode, wherein the capacitance-sensing circuit is operative to measure a first self-capacitance of the first electrode and a second self-capacitance of the second electrode, wherein the processing device is operative to compare the first and second self-capacitances against one or more thresholds to detect the combination of activations.

11. The apparatus of claim 8, wherein the processing device comprises a capacitance-sensing circuit coupled to the first electrode and the second electrode and a third electrode of the at least two electrodes of the capacitive button, wherein the capacitance-sensing circuit is operative to measure a first mutual capacitance between the third electrode and the first electrode and a second mutual capacitance between the third electrode and the second electrode, wherein the processing device is operative to compare the first and second mutual capacitances against one or more thresholds to detect the combination of activations.

12. A method comprising:
measuring, by a capacitance-sensing circuit programmed with a sensing parameter set to a first value, signals from a first sense element and a second sense element of a capacitive button, wherein the signals correspond to capacitances of the first sense element and the second sense element, and wherein an inner perimeter of the first sense element is disposed to surround an outer perimeter of the second sense element;
detecting, by processing logic, whether the first sense element is activated by a conductive object proximate to the capacitive button based on the measured signals;
detecting, by the processing logic, whether the second sense element is activated by the conductive object proximate to the capacitive button based on the measured signals;
adjusting, by the processing logic, the first value to a second value for the sensing parameter when the second sense element is activated and the first sense element is not activated; and
measuring, by the capacitance-sensing circuit with the sensing parameter set to the second value, an additional signal from the second sense element when the second sense element is activated and the first sense element is not activated.

13. The method of claim 12, further comprising measuring, by the capacitance-sensing circuit with the sensing parameter set to the first value, additional signals from the first sense element and the second sense element when the second sense element and first sense element are.

14. The method of claim 12, wherein the measuring with the sensing parameter set to the first value and measuring with the sensing parameter set to the second value comprise measuring self-capacitances of the first sense element and the second sense element.

15. The method of claim 12, further comprising driving, by the capacitance-sensing circuit, a first drive signal on a third sense element of the capacitive button, and wherein the measuring with the sensing parameter set to the first value and measuring with the sensing parameter set to the second value comprises measuring a first mutual capacitance between the third sense element and the first sense element and a second mutual capacitance between the third sense element and the second sense element.

16. The method of claim 12, further comprising distinguishing, by the processing logic, between a first type of conductive object and a second type of conductive object based on the signals measured with the sensing parameter set to the first value, wherein the conductive object is the first type when the second sense element is activated and the first sense element is not activated and the conductive object is the second type when the first sense element and the second sense element are activated.

17. The method of claim 12, further comprising distinguishing, by the processing logic, between a stylus and a finger as the conductive object, wherein the conductive object is the stylus when the second sense element is activated and the first sense element is not activated and the conductive object is the finger when the first sense element and the second sense element are activated.

18. The method of claim 12, wherein the measuring with the sensing parameter set to the first value comprises measuring the signals from the first sense element and the second sense element using a first sensitivity value, wherein the measuring the additional signal with the sensing parameter set to the second value comprises measuring the additional signal using a second sensitivity value, wherein the first sensitivity value is less than the second sensitivity value.

* * * * *